United States Patent
Tsai et al.

(10) Patent No.: US 9,455,200 B2
(45) Date of Patent: Sep. 27, 2016

(54) METHOD FOR SEMICONDUCTOR DEVICE FABRICATION

(71) Applicant: Taiwan Semiconductor Manufacturing Company, Ltd., Hsin-Chu (TW)

(72) Inventors: Chun Hsiung Tsai, Hsinchu County (TW); Jian-An Ke, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 14/456,241

(22) Filed: Aug. 11, 2014

(65) Prior Publication Data
US 2016/0042952 A1     Feb. 11, 2016

(51) Int. Cl.
| H01L 21/82 | (2006.01) |
| H01L 29/66 | (2006.01) |
| H01L 21/311 | (2006.01) |
| H01L 21/8238 | (2006.01) |
| H01L 21/3115 | (2006.01) |

(52) U.S. Cl.
CPC . *H01L 21/823821* (2013.01); *H01L 21/31155* (2013.01); *H01L 21/823814* (2013.01); *H01L 21/823864* (2013.01); *H01L 29/6653* (2013.01); *H01L 29/6681* (2013.01); *H01L 29/66545* (2013.01)

(58) Field of Classification Search
CPC ............... H01L 21/26586; H01L 21/823821; H01L 21/823814; H01L 29/6659; H01L 29/66636
See application file for complete search history.

(56) References Cited

U.S. PATENT DOCUMENTS

| 8,815,741 B1 * | 8/2014 | Richter | H01L 21/265 438/696 |
| 2011/0254080 A1 * | 10/2011 | Doris | H01L 21/26586 257/327 |
| 2012/0241868 A1 * | 9/2012 | Tsai | H01L 21/823807 257/369 |
| 2014/0248778 A1 * | 9/2014 | Moll | H01L 21/02107 438/696 |

* cited by examiner

*Primary Examiner* — Thanhha Pham
(74) *Attorney, Agent, or Firm* — Haynes and Boone, LLP

(57) ABSTRACT

A method of forming a semiconductor device includes receiving a substrate with a gate structure and forming a spacer layer over the substrate and the gate structure. The method further includes implanting carbon into the spacer layer at an angle tilted away from a first direction perpendicular to a top surface of the substrate, which increases etch resistance of the spacer layer on sidewalls of the gate structure. The method optionally includes implanting germanium into the spacer layer at the first direction, which decreases etch resistance of the spacer layer overlaying the gate structure and the substrate. The method further includes etching the spacer layer to expose the gate structure, resulting in a first portion of the spacer layer on the sidewalls of the gate structure. Due to increased etch resistance, the first portion of the spacer layer maintains its profile and thickness in subsequent fabrication processes.

19 Claims, 24 Drawing Sheets

METHOD FOR SEMICONDUCTOR DEVICE FABRICATION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

One advancement implemented as technology nodes shrink, in some IC designs, has been the replacement of the typically polysilicon gate electrode with a metal gate electrode to improve device performance with the decreased feature sizes. One process of forming a metal gate stack is termed a replacement-gate or "gate-last" process in which the final gate stack is fabricated "last" which allows for reduced number of subsequent processes, including high temperature processing, that is performed after formation of the gate. However, there are challenges to implementing such IC fabrication processes, especially with scaled down IC features in advanced process nodes, such as N20, N16 and beyond.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1B:
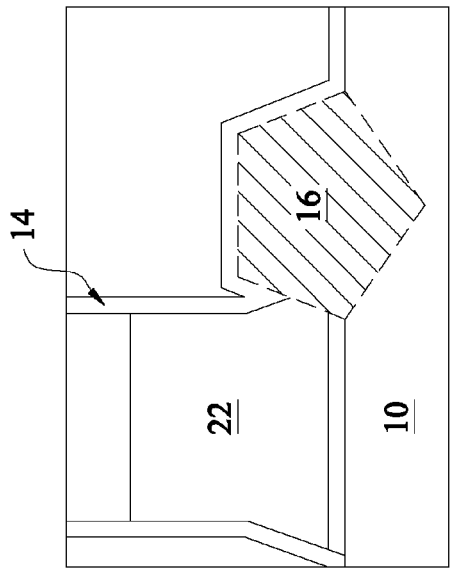
FIGS. 1A-1C illustrate some issues that might happen in a gate-last process.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
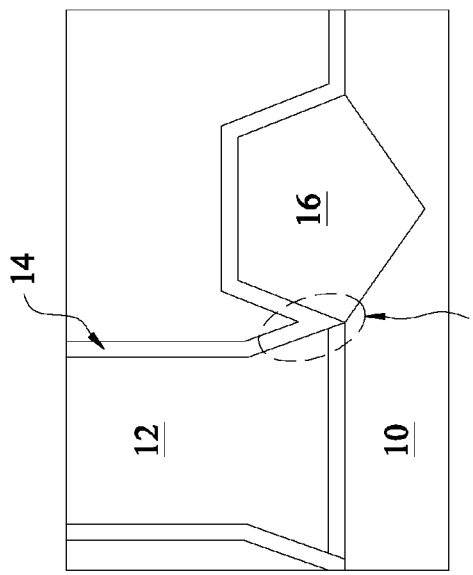
Figure 1C:
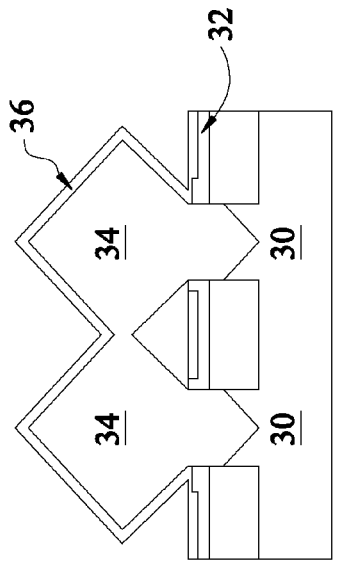

The present disclosure is generally related to methods for semiconductor device fabrication, and more particularly to methods of forming field effect transistors (FETs) using a gate-last process. In a typical gate-last process, a dummy gate structure is formed over a substrate as a placeholder for an actual gate stack. Then a spacer is formed surrounding the dummy gate structure. Subsequently, the substrate is etched adjacent to the dummy gate structure and the spacer thereby forming recesses in the substrate. Then, doped silicon features are epitaxially grown in the recesses. Thereafter, the dummy gate structure is removed, leaving an opening surrounded by the spacer. Finally, the actual gate stack including metal layers is formed in the opening. As semiconductor process technology advances to smaller regimes, such as 16 nanometer (nm) and beyond, some issues have been found with the above process, which are illustrated in FIGS. 1A-1C. For example, as shown in FIG. 1A, a dummy gate structure 12, formed over a substrate 10, may have footing issues—its lower portion being wider than its upper portion. As a result, a spacer 14, surrounding the dummy gate structure 12, slopes at its lower portion instead of being ideally straight up. When the substrate 10 is etched for growing a doped silicon feature 16, the foot of the spacer 14 might be thinned down or even broken through, as indicated by the dashed circle 18 in FIG. 1A. When this happens, the metal elements in the final gate stack 22 might intrude into the doped silicon feature 16, as shown in FIG. 1B, causing device failures. FIG. 1C illustrates another problem with a typical gate-last process in manufacturing fin-like FETs (FinFETs). Referring to FIG. 1C, two doped silicon features 34 are epitaxially grown out of two recesses 30 in two fins. The lower portions of the doped silicon features 34 are surrounded by a spacer 32 which has been shortened when the two recesses 30 are formed. As a result, the two doped silicon features 34 merge, causing device issues. Furthermore, the merged portion of the doped silicon features 34 prevents a hard mask layer 36 from depositing onto a portion of the spacer 32, subjecting that portion of the spacer 32 to unwanted subsequent etching processes. The present disclosure provides embodiments of a method for fabricating semiconductor devices, which overcomes the above issues and enhances the quality of devices thereby formed.

Figure 2:
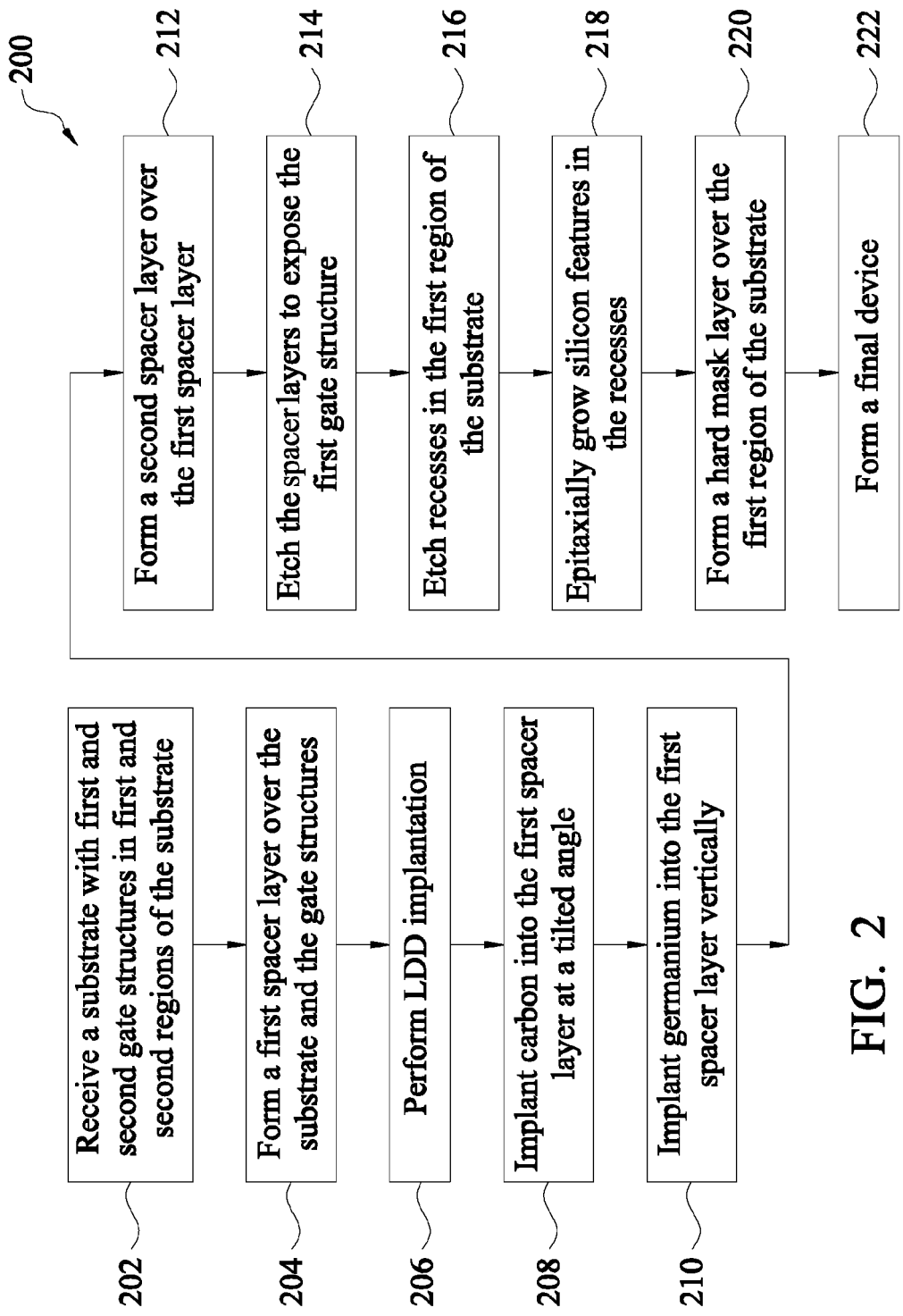
FIG. 2 shows a block diagram of a method of forming a semiconductor device, according to various aspects of the present disclosure.

Referring to FIG. 2, shown therein is a method 200 of forming a semiconductor device according to various aspects of the present disclosure. The method 200 is an example, and is not intended to limit the present disclosure beyond what is explicitly recited in the claims. Additional operations can be provided before, during, and after the method 200, and some operations described can be replaced, eliminated, or moved around for additional embodiments of the method. The method 200 is described below in conjunction with FIGS. 3-15 which are side and cross-sectional views of a device 300 according to various aspects of the present disclosure.

As will be shown, the device 300 illustrates two FinFETs in two regions of a substrate. This is provided for simplification and ease of understanding and does not necessarily limit the embodiments to any types of devices, any number of devices, any number of regions, or any configuration of structures of regions. For example, the same inventive concept can be applied in fabricating planar FET devices. Furthermore, the device 300 may be an intermediate device fabricated during processing of an IC, or a portion thereof, that may comprise static random access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, other memory cells, and combinations thereof.

Figure 3:
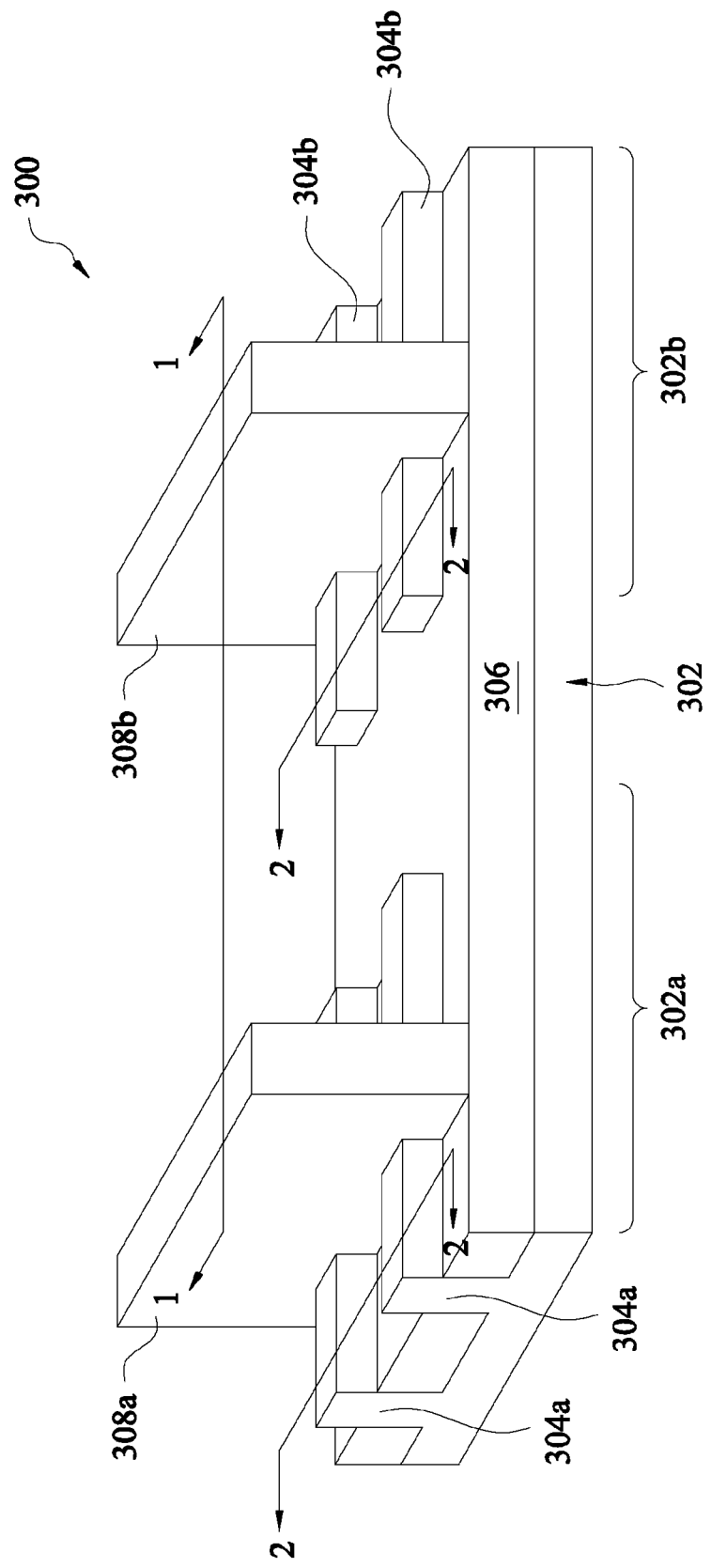
FIGS. 3-15 illustrate side and cross sectional views of forming a target semiconductor device according to the method of FIG. 2, in accordance with an embodiment.

At operation 202, the method 200 (FIG. 2) receives a substrate 302 with gate structures formed thereon. Referring to FIG. 3, the substrate 302 is a silicon substrate in the present embodiment. Alternatively, the substrate 302 may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In yet another alternative, the substrate 302 is a semiconductor-on-insulator (SOI) such as a buried dielectric layer.

The substrate 302 further includes active regions such as p-wells and n-wells. In the present embodiment, the substrate 302 includes a first region 302a and a second region 302b. The first region 302a includes two fins 304a that are suitable for forming NFET devices. The second region 302b includes two fins 304b that are suitable for forming PFET devices. The fins 304a/b may be fabricated using suitable processes including photolithography and etch processes. The photolithography process may include forming a photoresist layer (resist) overlying the substrate 302, exposing the resist to a pattern, performing post-exposure bake processes, and developing the resist to form a masking element including the resist. The masking element is then used for etching recesses into the substrate 302, leaving the fins 304a/b on the substrate 302. The etching process can include dry etching, wet etching, reactive ion etching (RIE), and/or other suitable processes. Alternatively, the fins 304a/b may be formed by double-patterning lithography (DPL) process. Numerous other embodiments of methods to form the fins 304a/b on the substrate 302 may be suitable.

The first and second regions 302a and 302b, more particularly the fins 304a and 304b, are separated by an isolation structure 306. The isolation structure 306 may be formed of silicon oxide, silicon nitride, silicon oxynitride, fluoride-doped silicate glass (FSG), a low-k dielectric material, and/or other suitable insulating material. The isolation structure 306 may be shallow trench isolation (STI) features. In an embodiment, the isolation structure 306 is formed by etching trenches in the substrate 302, e.g., as part of the fins 304a/b formation process. The trenches may then be filled with isolating material, followed by a chemical mechanical planarization (CMP) process. Other isolation structure 306 such as field oxide, LOCal Oxidation of Silicon (LOCOS), and/or other suitable structures are possible. The isolation structure 306 may include a multi-layer structure, for example, having one or more thermal oxide liner layers.

Still referring to FIG. 3, the device 300 further includes a first gate structure 308a and a second gate structure 308b over the substrate 302. Particularly, the first gate structure 308a is in the first region 302a, engaging with the fins 304a; and the second gate structure 308b is in the second region 302b, engaging with the fins 304b. The gate structures 308a/b may each include a gate dielectric layer, a gate electrode layer, and/or one or more additional layers. In an embodiment, the gate structures 308a/b include polysilicon. In the present embodiment, the gate structures 308a/b are sacrificial gate structures, i.e., placeholder for final gate stacks.

Figure 4A:
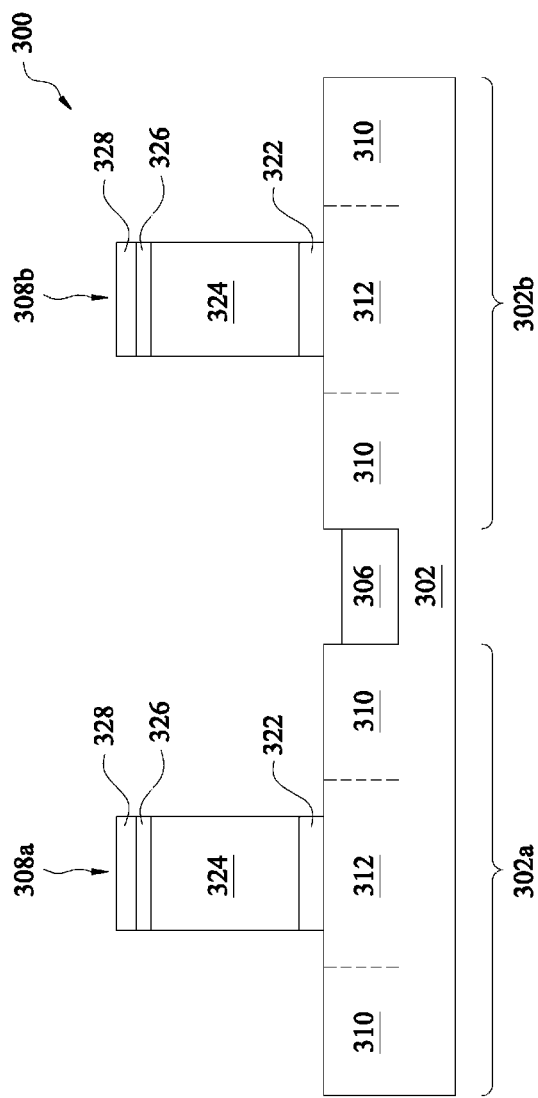
Figure 4B:
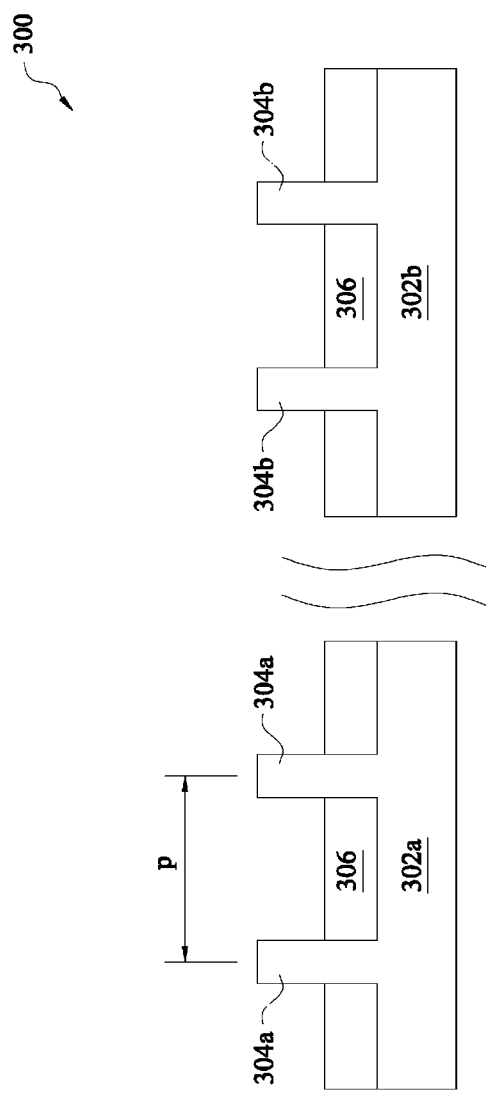

FIG. 4A is a cross-sectional view of the device 300 along the "1-1" line of FIG. 3. FIG. 4B is a cross-sectional view of the device 300 along the "2-2" lines of FIG. 3, showing both the first and second regions 302a/b in the same drawing. Refer to FIG. 4A, in the present embodiment, the gate structures 308a/b engage with the respective fins 304a/b and effectively divide each fin into three regions—the source/drain regions 310 adjacent to the gate structures 308a/b and the channel region 312 underneath the gate structures 308a/b. For the sake of simplicity, same reference numerals are used to label similar features in the regions 302a and 302b. However, in various embodiments, the features in the regions 302a and 302b, such as the gate structures 308a and 308b as well as the fins 304a and 304b, can be the same or different in material, composition, structure, and/or other aspects.

Still referring to FIG. 4A, in the present embodiment, the gate structures 308a/b each include an oxide layer 322, a gate electrode layer 324, a hard mask layer 326, and a capping layer 328. In the present embodiment, the oxide layer 322 and the gate electrode layer 324 are also called dummy oxide layer 322 and dummy gate electrode layer 324 respectively because they will be replaced with a final gate stack. The oxide layer 322 may include a dielectric material such as silicon oxide, and may be formed by chemical oxidation, thermal oxidation, atomic layer deposition (ALD), chemical vapor deposition (CVD), and/or other suitable methods. The gate electrode layer 324 may comprise a single layer or multilayer structure. In an embodiment, the gate electrode layer 324 comprises polysilicon. The gate electrode layer 324 may be formed by suitable deposition processes such as low-pressure chemical vapor deposition (LPCVD) and plasma-enhanced CVD (PECVD). In an embodiment, the oxide layer 322 and the gate electrode layer 324 are first deposited as blanket layers over the substrate 302. Then the blanket layers are patterned through a process including photolithography processes and etching processes thereby removing portions of the blanket layers and keeping the remaining portions over the substrate 302 as the oxide layer 322 and the gate electrode layer 324. In an embodiment, the hard mask layer 326 is a layer of silicon nitride and the capping layer 328 includes silicon oxide. The hard mask layer 326 and the capping layer 328 may be formed by deposition and etching processes similar to those forming the oxide layer 322 and the gate electrode layer 324.

Referring to FIG. 4B, the first and second regions 302a/b each include two fins, the fins 304a and 304b respectively. Furthermore, the two fins have a center-to-center pitch "p." In the present embodiment, the pitch "p" is about 48 nanometers (nm).

Figure 5A:
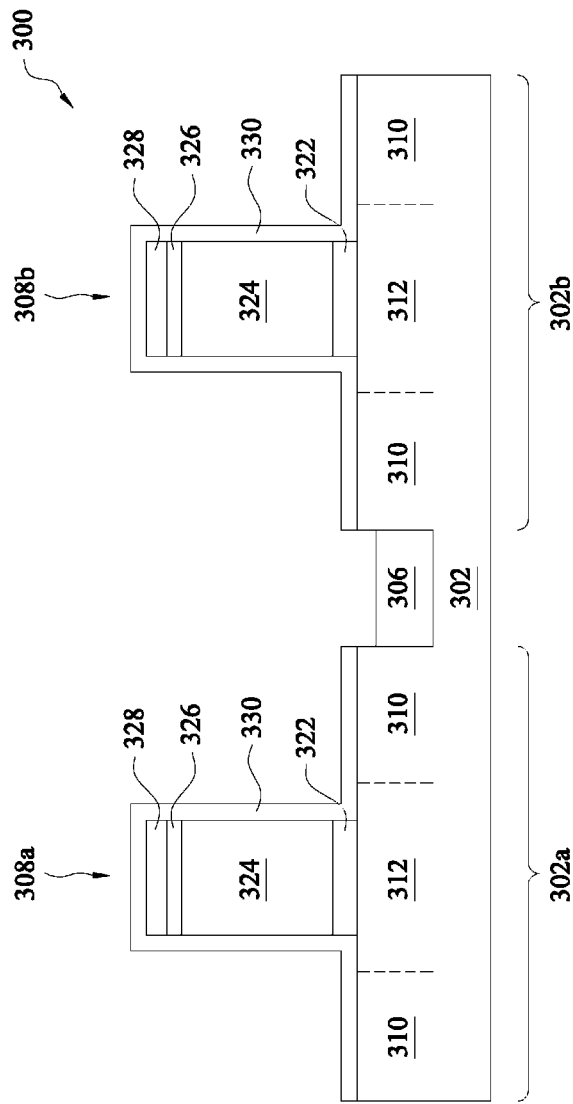
Figure 5B:
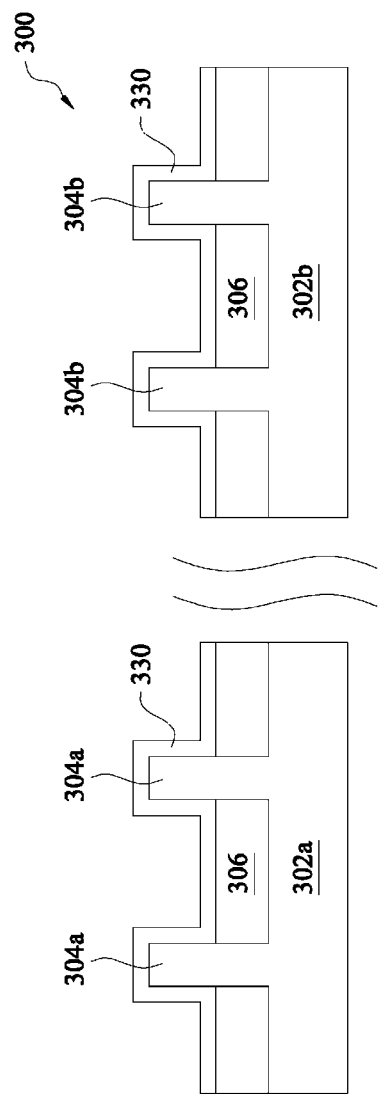

The method 200 (FIG. 2) proceeds to operation 204 to form a first spacer layer 330 over the substrate 302 and the gate structures 308a/b. Referring to FIGS. 5A and 5B, the first spacer layer 330 is conformal to the gate structures 308a/b and the fins 304a/b. In an embodiment, the first spacer layer 330 is formed by ALD. Alternatively, it may be formed by thermal deposition or other suitable methods. In an embodiment, the first spacer layer 330 includes silicon nitride (SiN). Alternatively, the first spacer layer 330 may include SiCN or SiCON. In an embodiment, the first spacer layer 330 has a thickness in a range from about 2 to about 6 nm, such as 5 nm.

Figure 6A:
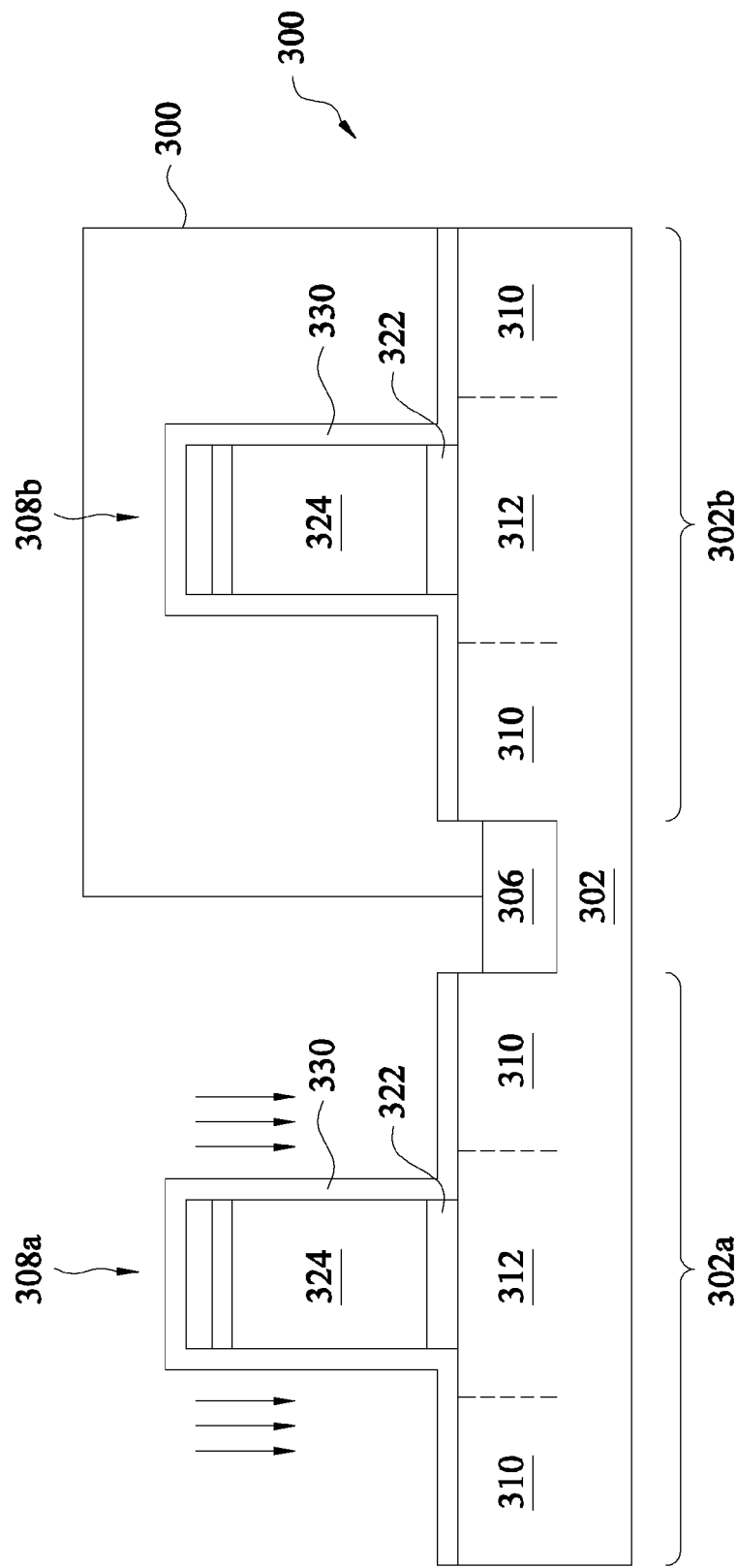
Figure 6B:
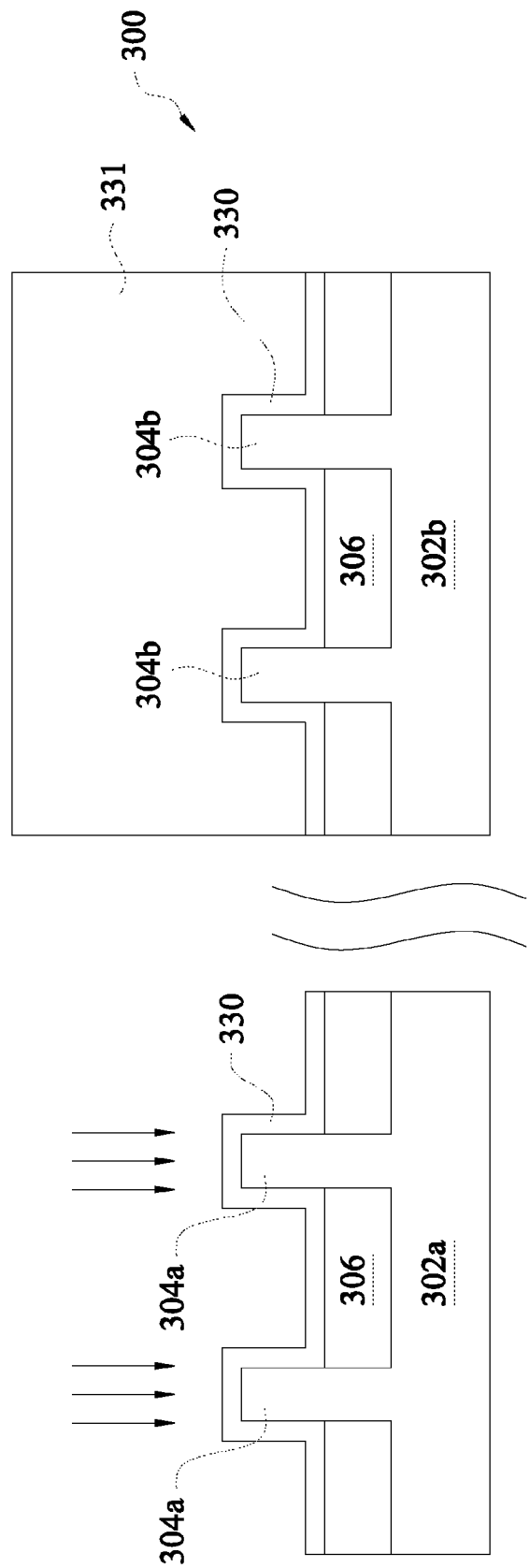

The method 200 (FIG. 2) proceeds to operation 206 to perform lightly doped source/drain (LDD) ion implantation. The LDD implantation process may utilize n-type dopants, such as phosphorus (P) or arsenic (As), for the NFET devices in the first region 302a and p-type dopants, such as boron (B) or indium (In), for the PFET devices in the second region 302b. Referring to FIGS. 6A and 6B, a masking element 331 is formed to cover the second region 302b when the first region 302a undergoes the LDD implantation. In an embodiment, the masking element 331 is a patterned photoresist. The masking element 331 is removed after the LDD implantation has completed in the first region 302a. A similar masking element is formed to cover the first region 302a when the second region 302b undergoes the LDD implantation. Since the first spacer layer 330 is thin (e.g., only 5 nm), it does not impede the LDD implantation process. In some embodiments, the first spacer layer 330 helps distribute the ions in the source/drain regions 310. The LDD implantation of operation 206 may alternatively be performed before the first spacer layer 330 is formed.

Figure 7A:
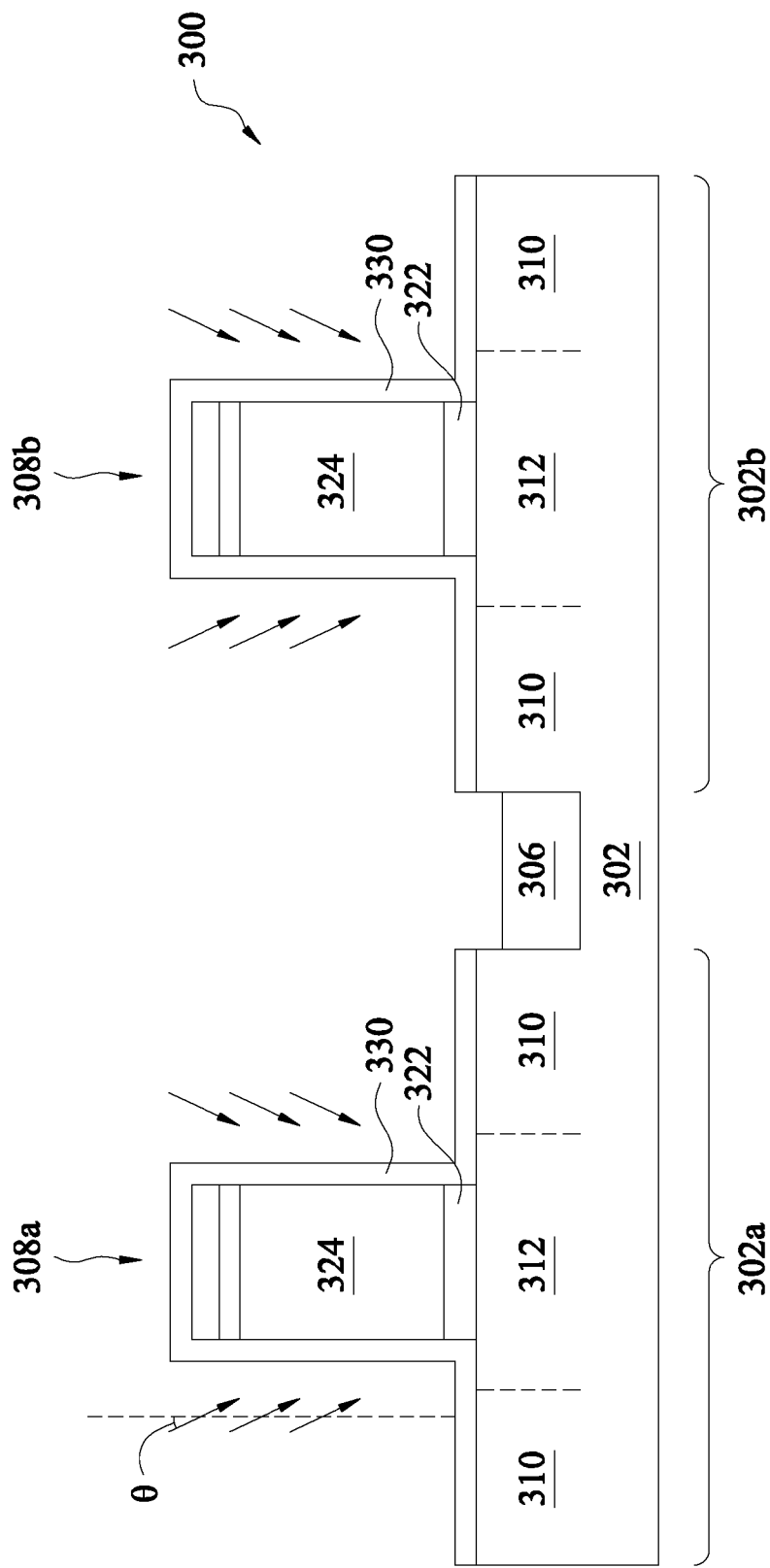
Figure 7B:
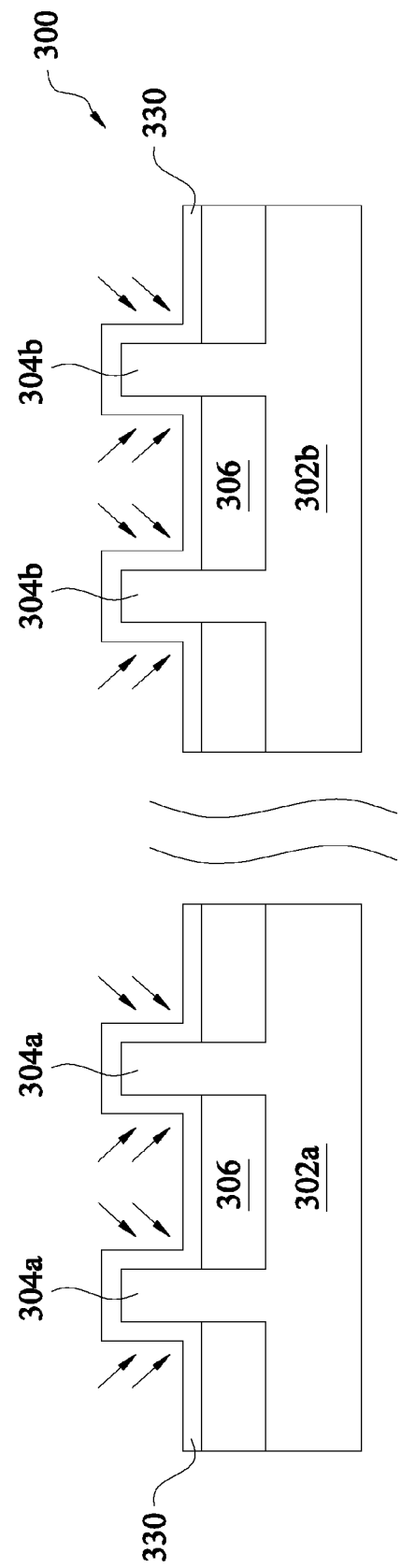

The method 200 (FIG. 2) proceeds to operation 208 to implant carbon into the first spacer layer 330 at a tilted angle of incidence. Referring to FIG. 7A, the carbon ion beam is tilted away by an angle "θ" from a normal to a top surface of the substrate 302 (as indicated by the dashed line in FIG. 7A). It has been found that implantation of carbon into the first spacer layer 330 increases the etch resistance thereof. Hence, implanting carbon into the first spacer layer 330 at the tilted angle "θ" effectively increases the etch resistance of the spacer material on sidewalls of the gate structures 308a/b. In an embodiment, the angle "θ" is in a range from about 10 to about 45 degrees. It is further noted that, in the present embodiment, operation 208 is performed to both the first and the second regions 302a/b without masking elements (e.g., a patterned photoresist) on either region. This helps minimize shadow effect which might have occurred if there were masking elements with high aspect ratio. In various embodiments, the implanting of carbon is performed with an energy ranging from about 0.5 to about 5 keV such as from about 0.5 to about 1 keV and a dose ranging from about $1 \times e^{14}$ to about $2 \times e^{15}$ cm$^{-3}$ such as from about $1 \times e^{14}$ to about $1 \times e^{15}$ cm$^{-3}$. Referring to FIG. 7B, the first spacer layer 330 on sidewalls of the fins 304a/b is also implanted with carbon at a tilted angle of incidence. In various embodiments, the gate structures 308a/b and the fins 304a/b are oriented at a 90 degree intersection, therefore the carbon ion beams are scanned multiple times (e.g., four times) to complete the implantation process to the first spacer layer 330 on both the sidewalls of the gate structures 308a/b and the sidewalls of the fins 304a/b. Due to increased etch resistance, the first spacer layer 330 will have well-controlled profile and thickness when the fins 304a/b and/or the gate structures 308a/b are etched in later steps. Furthermore, in an embodiment of the method 200, operation 206 is performed before operation 208 so that LDD implantation is not affected by the modified property of the first spacer layer 330.

Figure 8A:
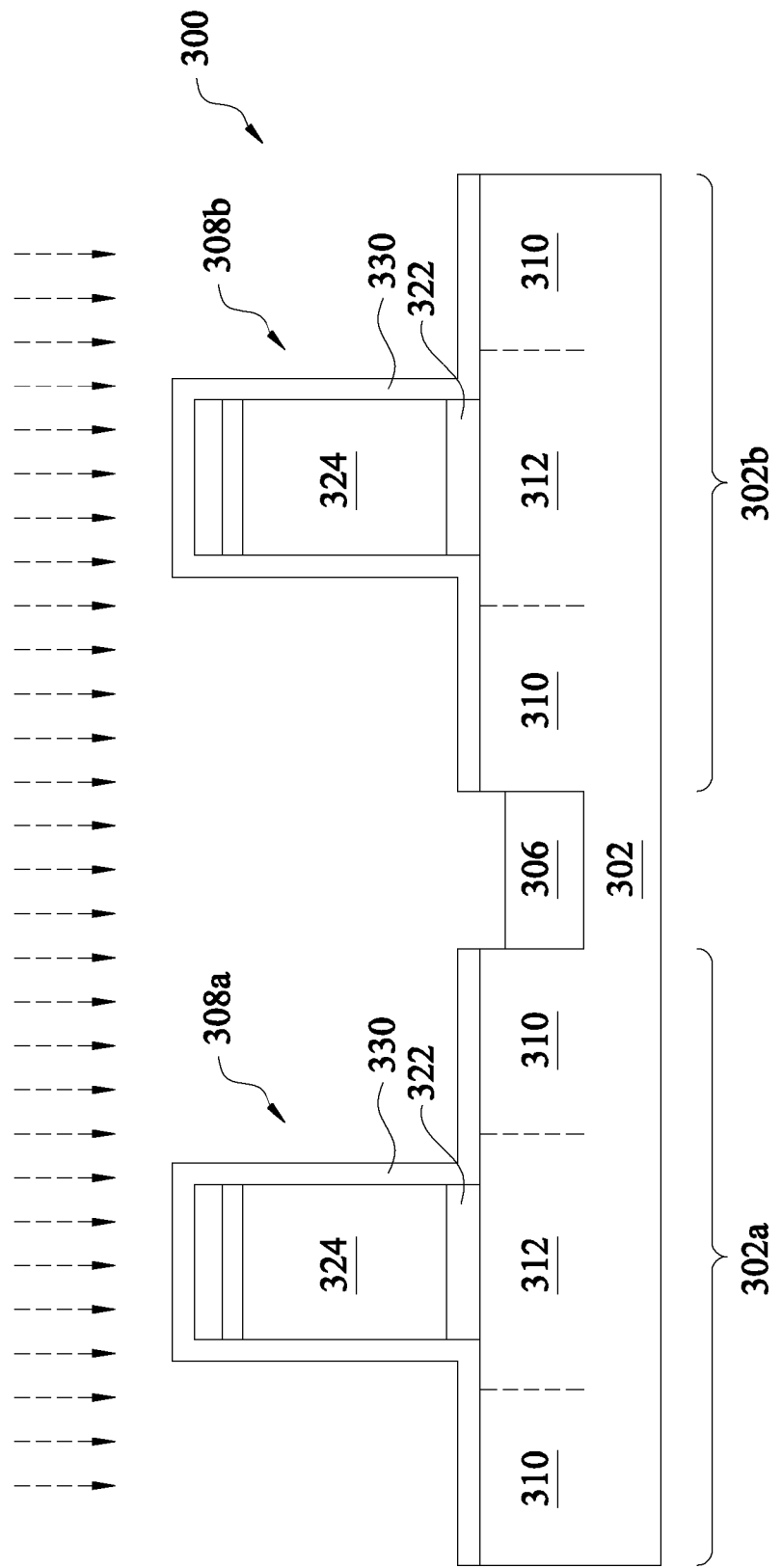
Figure 8B:
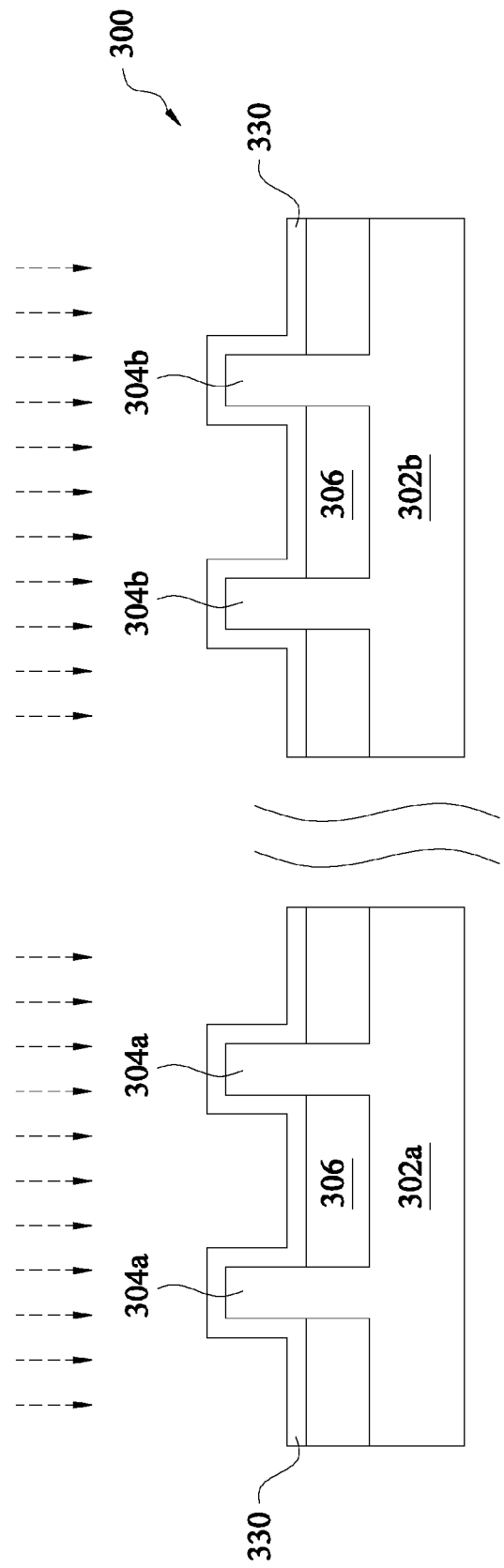

The method 200 (FIG. 2) proceeds to operation 210 to implant germanium into the first spacer layer 330 at a direction perpendicular to the top surface of the substrate 302 (i.e., parallel to the normal), as shown in FIGS. 8A and 8B. It has been found that implanting germanium into the first spacer layer 330 decreases the etch resistance thereof. Hence, operation 210 effectively decreases the etch resistance of a portion of the first spacer layer 330 that overlays on top of the gate structures 308a/b, the fins 304a/b, and the isolation structure 306. However, since the germanium are implanted vertically towards the top surface of the substrate 302, they do not substantially alter the etch resistance of the first spacer layer 330 on the sidewalls of the gate structures 308a/b and the fins 304a/b. The combined effects of the operations 208 and 210 are that the first spacer layer 330 becomes easier to etch on top of the gate structures 308a/b, the fins 304a/b, and the isolation structure 306, but harder to etch on the sidewalls of the gate structures 308a/b and the fins 304a/b. In an embodiment, the implanting of germanium is performed with an energy ranging from about 1 keV to about 10 keV and a dose ranging from about $1 \times e^{14}$ to about $2 \times e^{15}$ cm$^{-3}$. In some embodiments of the method 200, operation 210 is optional, i.e., operation 208 may be performed without being accompanied with operation 210, and some benefits of the present disclosure are still realized.

Figure 9A:
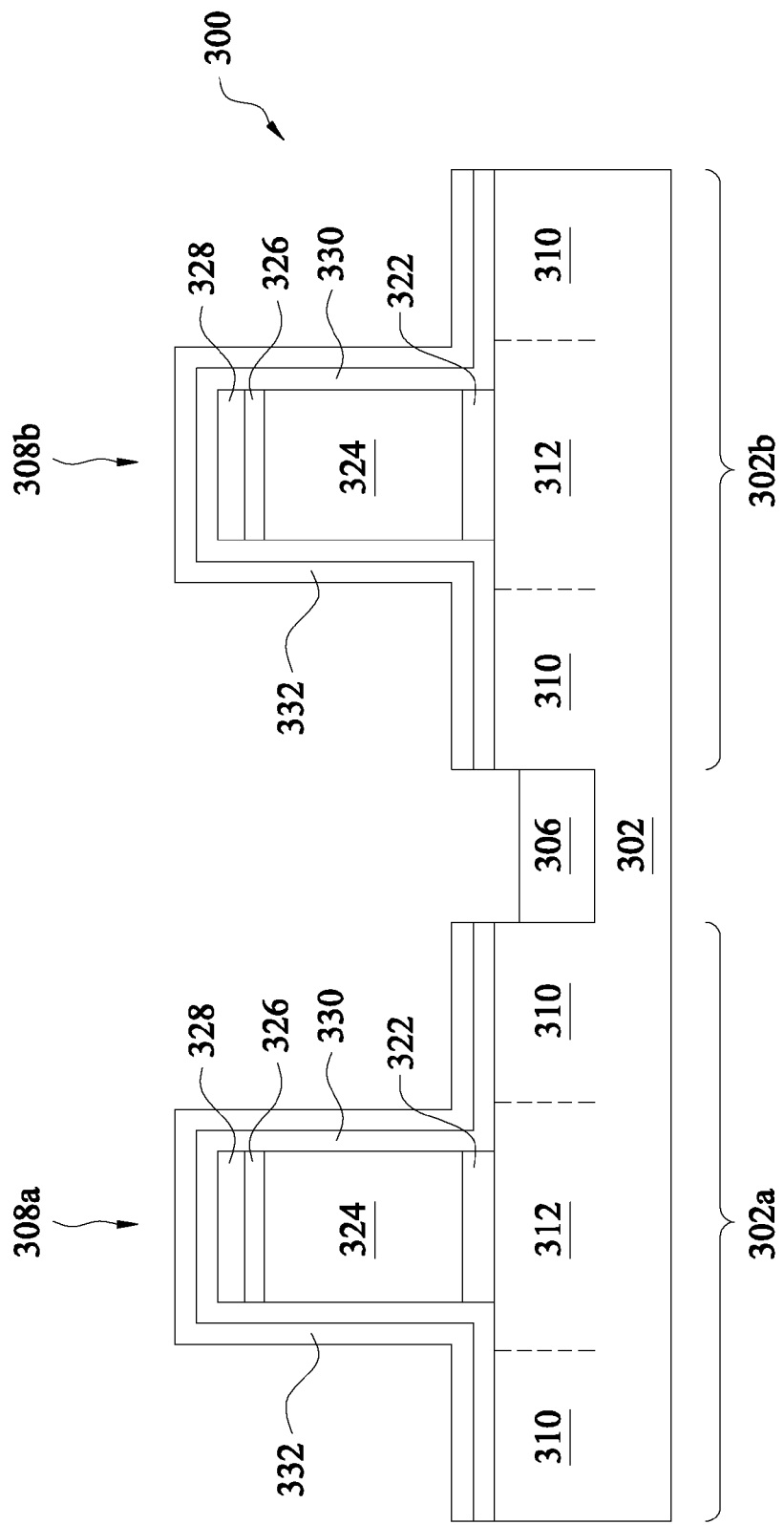
Figure 9B:
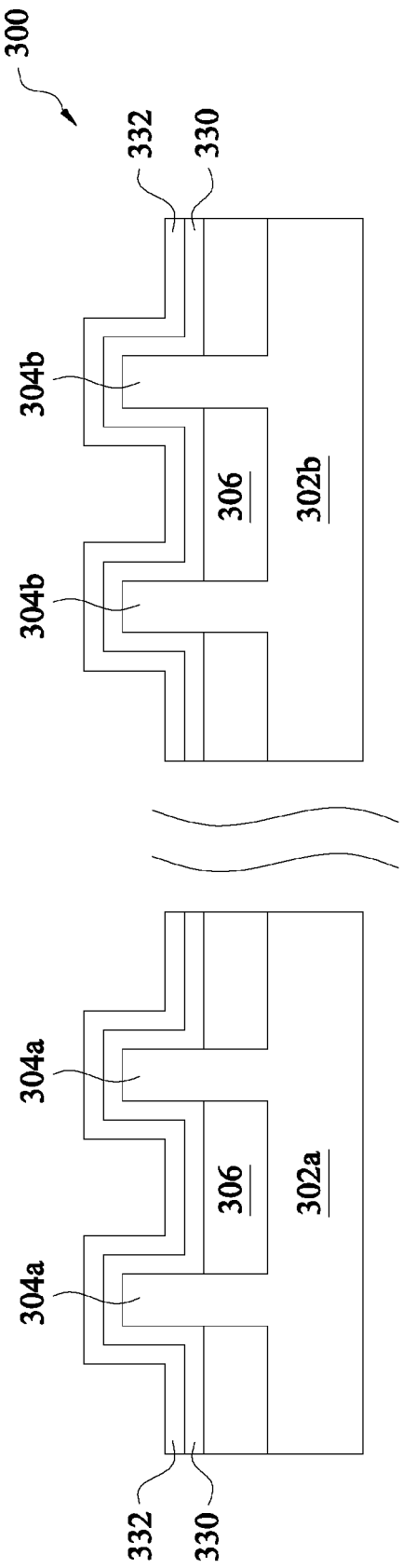

The method 200 (FIG. 2) proceeds to operation 212 to form a second spacer layer 332 over the first spacer layer 330. Referring to FIGS. 9A and 9B, the second spacer layer 332 is also conformal to the gate structures 308a/b and to the fins 304a/b. In an embodiment, the second spacer layer 332 is formed by ALD. Alternatively, it may be formed by thermal deposition or other suitable methods. In an embodiment, the second spacer layer 332 includes SiN. Alternatively, the second spacer layer 332 may include SiCN, SiCON, or other suitable materials. In an embodiment, the second spacer layer 332 has a thickness in a range from about 2 to about 6 nm, such as 5 nm. The second spacer 332 provides an offset for etching the source/drain regions 310 in later steps. In various embodiments, the second spacer layer 332 is implanted with carbon and optionally germanium in a process similar to operations 208 and 210 discussed above. In an embodiment, the second spacer layer 332 includes more than one layer of material. For example, it may include two layers of material and each layer can be SiN, SiCN, SiCON, other suitable material, or a combination thereof. To further this embodiment, each of the two layers is conformal to the gate structures 308a/b and the fins 304a/b, may be formed by ALD or other suitable methods, and has a thickness in a range from about 2 to about 6 nm, such as 5 nm. In addition, the two layers may individually or collectively undergo the carbon implantation and the optional germanium implantation discussed above. In an embodiment, the operations 208 and 210 are not performed immediately after the first spacer layer 330 is formed, but rather performed after both the first and second spacer layers 330 and 332 are formed.

Figure 10A:
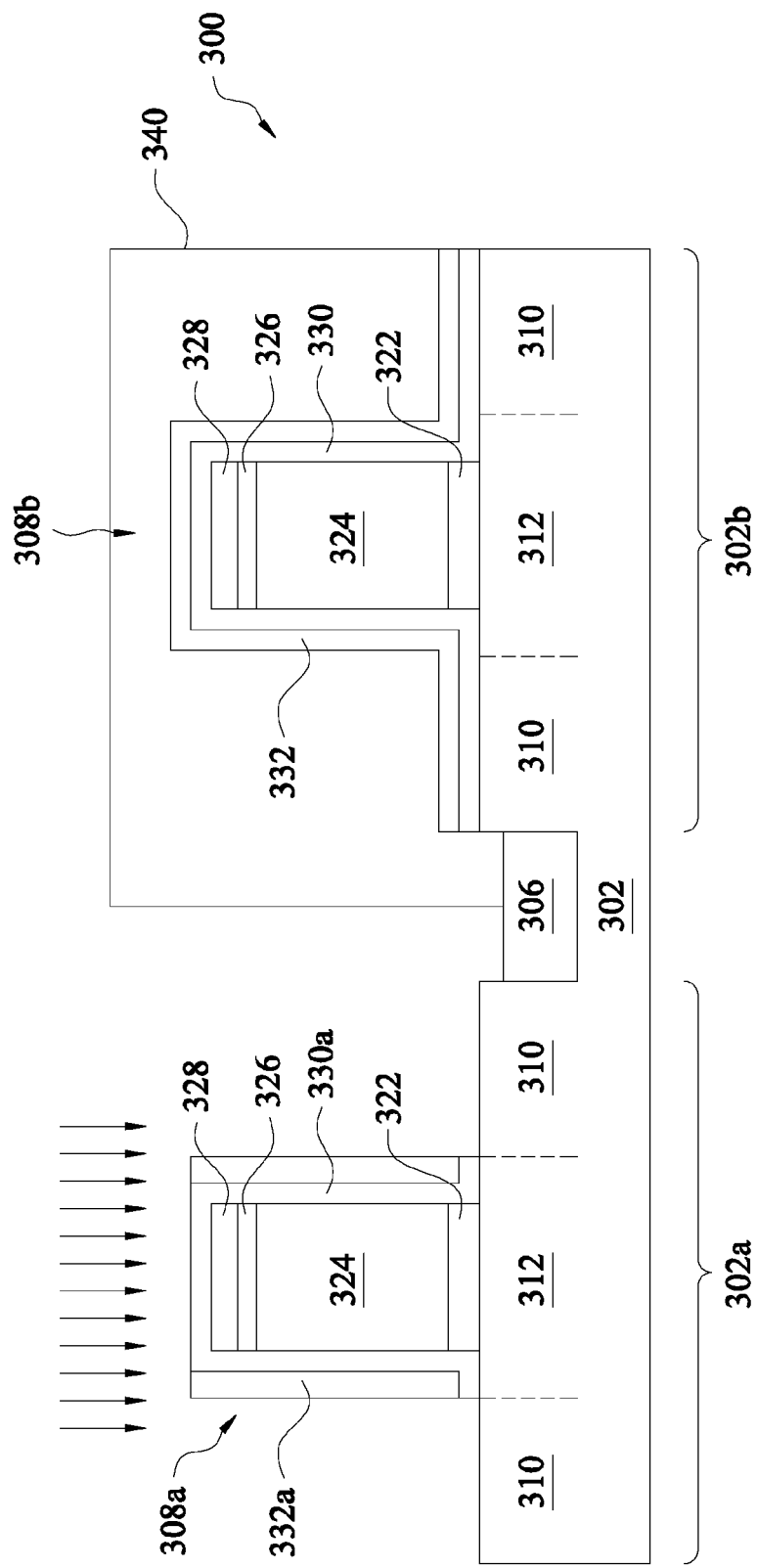
Figure 10B:
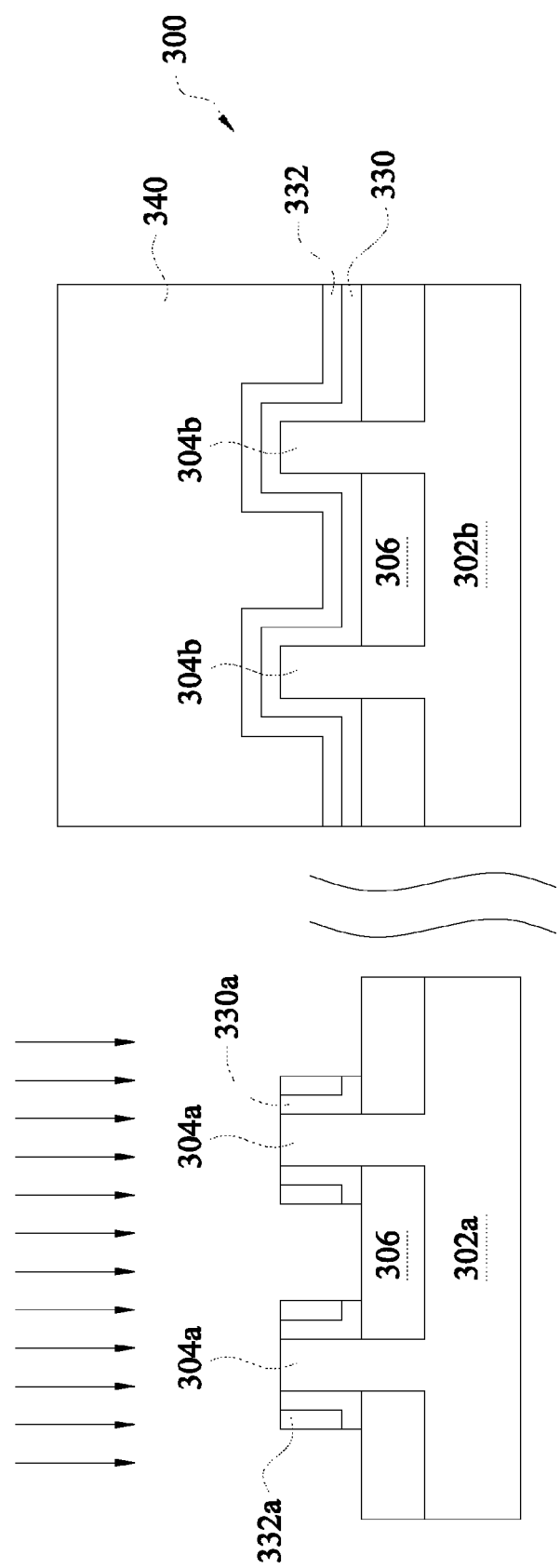

The method 200 (FIG. 2) proceeds to operation 214 to etch the spacer layers 330 and 332 thereby exposing the gate structure 208a and the fins 304a. Referring to FIGS. 10A and 10B, in the present embodiment, a masking element 340 is formed over the second region 302b to protect structures thereon from the etching process. A dry etching process is performed to anisotropically etch the spacer layers 330 and 332 such that a first portion of the spacer layers 330 and 332 directly overlying the gate structure 308a, the fins 304a, and the isolation structure 306 is removed but a second portion of the spacer layers 330 and 332 remains on the sidewalls of the gate structure 308a and the fins 304a. The second portion of the spacer layers 330 and 332 are referred to as spacers 330a and 332a respectively in the following discussion. Due to the carbon implantation in operation 208 and optionally the germanium implantation in operation 210, the spacers 330a and 332a substantially maintain their profile and thickness during the etching process. In an embodiment, the masking element 340 is a patterned photoresist and is formed by a photolithography process. For example, the photolithography process may include forming a photoresist layer (resist) overlying the substrate 302, exposing the resist to a pattern, performing post-exposure bake processes, and developing the resist to form the masking element 340. In another embodiment, the masking element 340 is a patterned hard mask layer. This may be done through various processes. For example, a hard mask layer may be blanket deposited over both the regions 302a and 302b by an ALD process. The hard mask layer may include SiN, SiCN, SiCON, or other suitable materials and may be conformal to the gate structures 308a/b and the fins 304a/b. Then a photoresist is formed over the hard mask layer and is patterned to have openings. The hard mask layer and the spacer layers 332 and 330 are etched through the openings thereby exposing the gate structure 308a and the fins 304a. Thereafter, the patterned photoresist is removed, leaving the hard mask layer over the substrate 302 as the masking element 340. This may reduce contamination associated with photoresist material during subsequent processes.

Figure 11A:
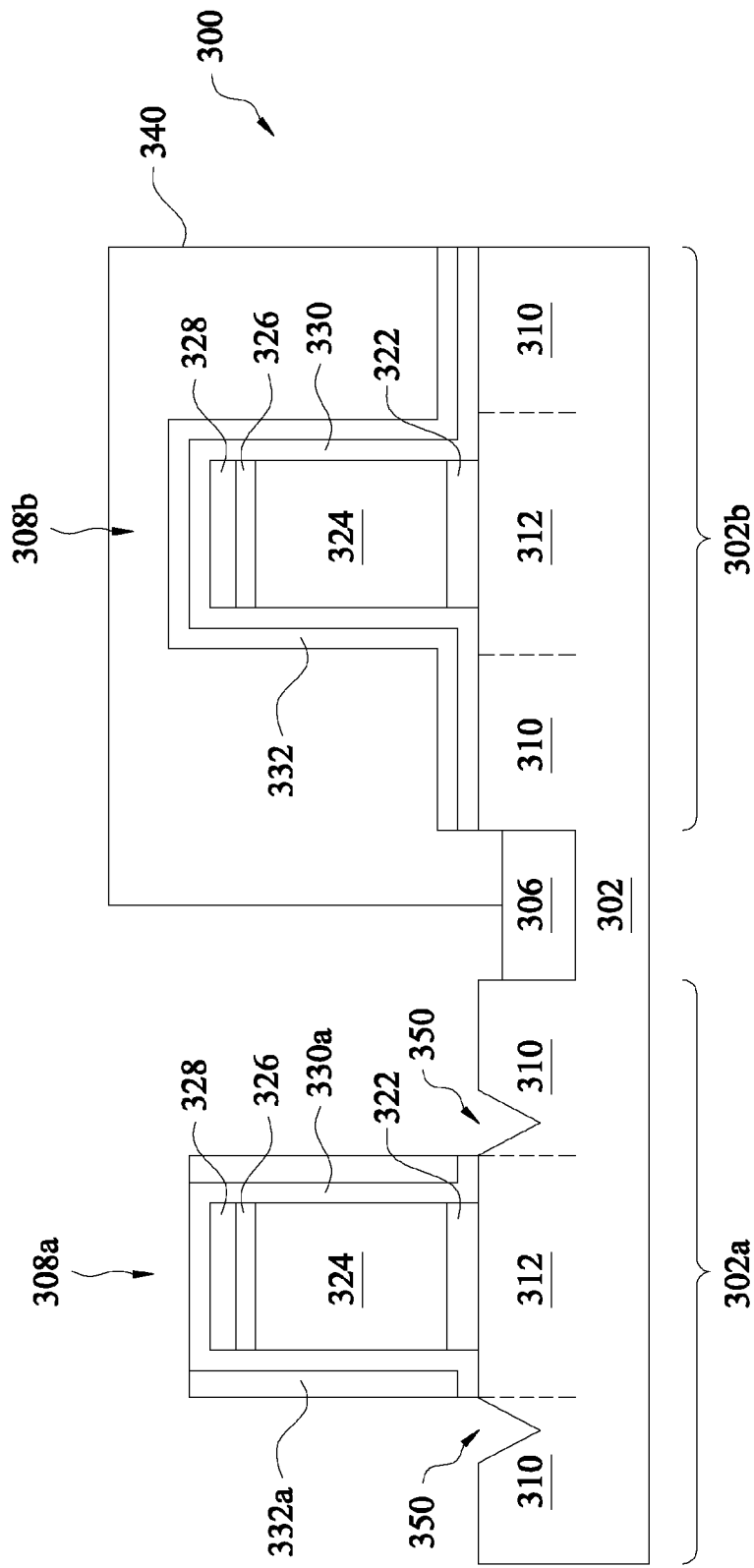
Figure 11B:
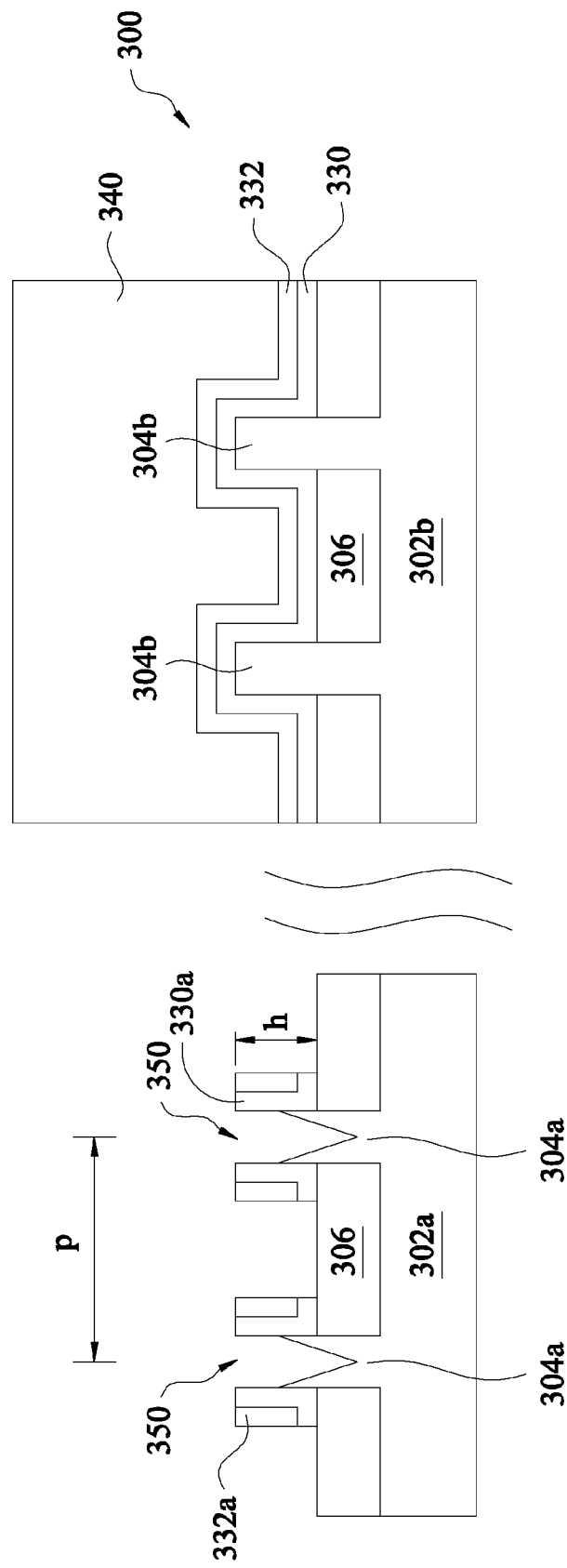

The method 200 (FIG. 2) proceeds to operation 216 to etch the fins 304a thereby forming recesses 350 in the source/drain regions 310. Referring to FIGS. 11A and 11B, the two recesses 350 are formed in the source/drain regions 310 adjacent to the gate structure 308a and the spacers 330a and 332a. The recesses 350 may have vertical sidewalls, tapered sidewalls, or other profiles. The etching process may be dry (plasma) etching, wet etching, and the like. In an embodiment, the etching process includes a dry etching process that utilizes a combination of HBr/Cl2/O2/He. In an embodiment, one or more photolithography processes are used to define the regions to be etched. In some cases, the recesses 350 are etched really close to the spacers 330a and 332a. In a typical fabrication process, this might cause issues as illustrated in FIG. 1A. However, in the present embodiment, due to the carbon implantation in operation 208, the spacers 330a and 332a have higher etch resistance and are able to maintain their thickness during the etching process. Furthermore, as shown in FIG. 11B, the spacers 330a and 332a on the sidewalls of the fins 304a can be controlled to a certain height "h" during the etching process, thanks to their increased etch resistance. In an embodiment, depending on the pitch "p" of the fins 304a, the height "h" can be well-controlled to facilitate a subsequent epitaxial growth process. In an embodiment, the pitch "p" is about 48 nm and the height "h" is controlled in a range from about 11 to about 13 nm, such as about 12 nm. After the etching process, a cleaning process may be performed that cleans the recesses 350 with a hydrofluoric acid (HF) solution or other suitable solution.

Figure 12A:
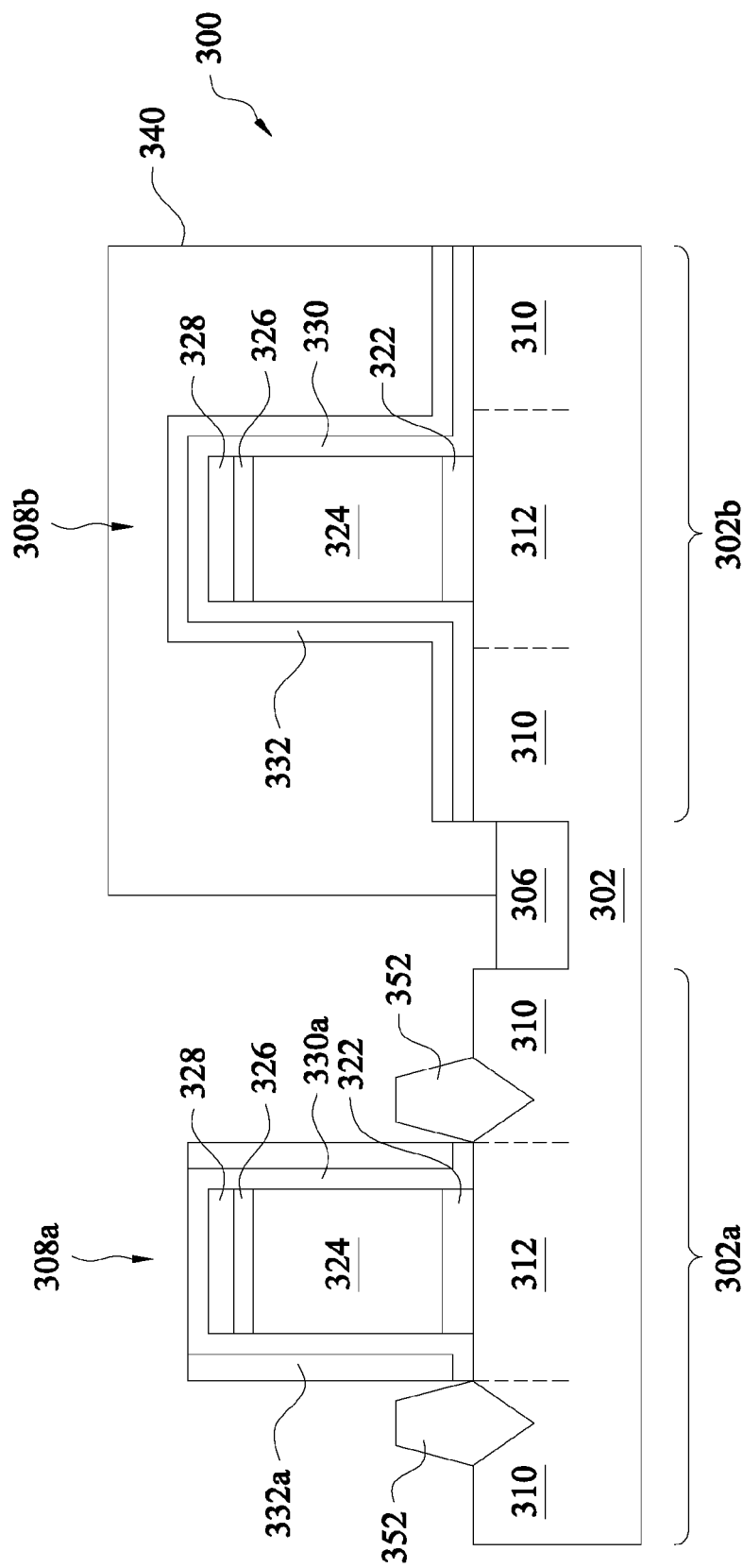
Figure 12B:
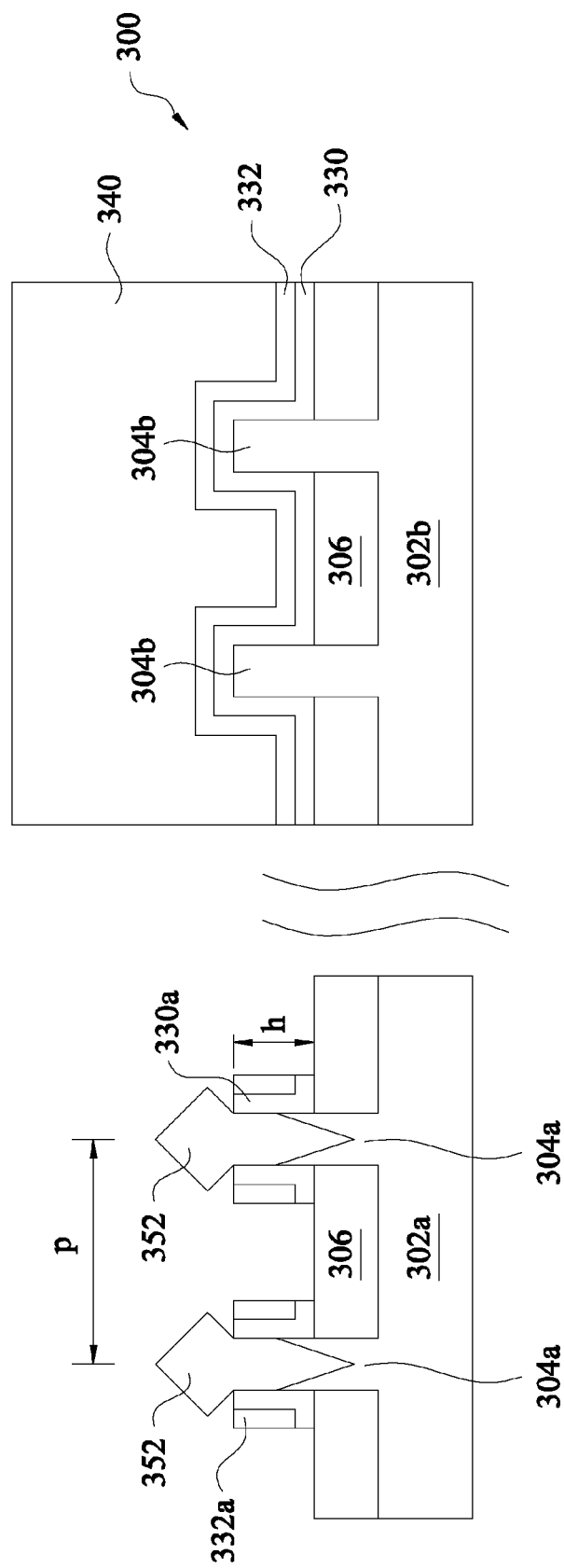

The method 200 (FIG. 2) proceeds to operation 218 to form silicon features 352 in the recesses 350 by one or more epitaxial growth processes, as shown in FIGS. 12A and 12B. In an embodiment, the epitaxial growth process is a low pressure chemical vapor deposition (LPCVD) process using a silicon-based precursor gas. Further, in the present example, the epitaxial growth process in-situ dopes the grown silicon with an n-type dopant such as P, As, or combinations thereof for forming doped silicon features for an NFET device. As shown in FIG. 12A, the silicon features 352 are grown in close proximity to the channel region 312, thus providing stress and strain to the channel region 312 and enhancing carrier mobility thereof. As shown in FIG. 12B, the spacers 330a and 332a are tall enough to prevent the silicon features 352 from merging with each other in the growth process, overcoming the issue presented in FIG. 1C.

Figure 13A:
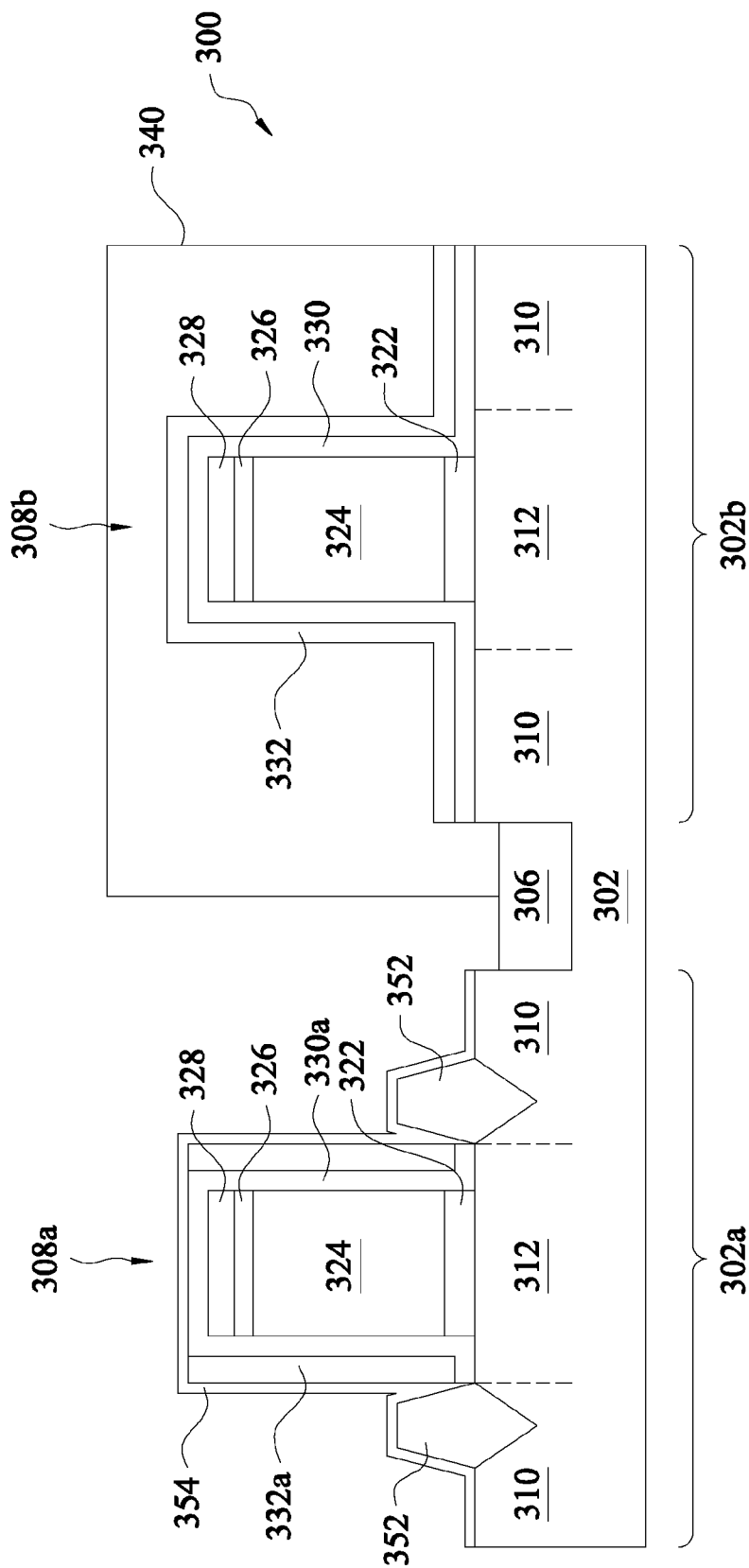
Figure 13B:
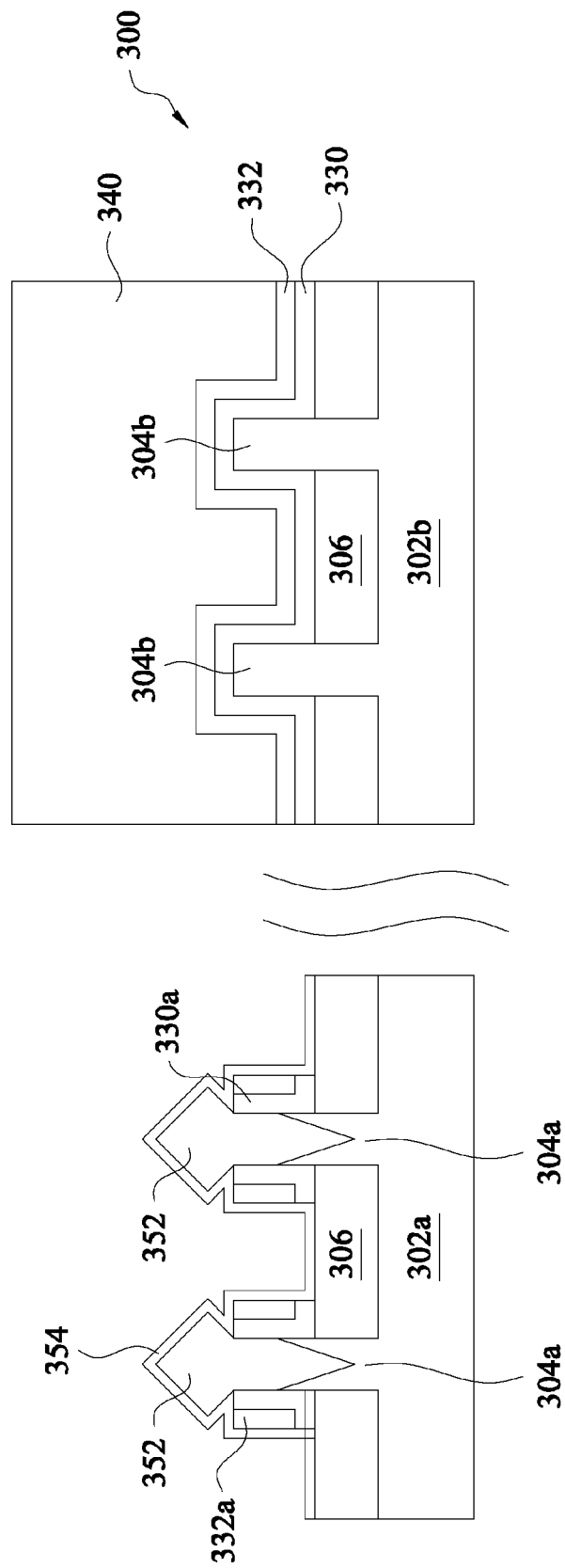

The method 200 (FIG. 2) proceeds to operation 220 to form a hard mask layer 354 over the first region 302a. Referring to FIGS. 13A and 13B, the hard mask layer 354 is deposited over the gate structure 308a, the spacers 330a and 332a, and the silicon features 352 so as to protect them from subsequent processes to the second region 302b. In the present embodiment, the hard mask layer 354 is conformal to the various structures covered underneath. In various embodiments, the hard mask layer 354 may use SiN, SiCN, SiCON, or other suitable materials and can be formed by ALD, thermal oxidation, or other suitable methods. In an embodiment, the hard mask layer 354 has a thickness in a range from about 2 to about 6 nm, such as 5 nm. Because the silicon features 354 are properly separated from each other, the hard mask layer 354 is able to cover the entire second region 302b, avoiding the issue presented in FIG. 1C.

The method 200 (FIG. 2) proceeds to operation 222 to form a final device by various processes. In an embodiment, the method 200 performs operations similar to operations 214, 216, and 218 so as to form doped silicon features in the source/drain regions 310 of the fins 304b. In an exemplary embodiment, first, the masking element 340 is either removed (e.g., when it is a patterned photoresist) or patterned (e.g., when it is a hard mask layer); then the spacer layers 332 and 330 are etched in the second region 302b to expose the gate structure 308b and the fins 304b; subsequently, the fins 304b are etched to form recesses adjacent to the gate structure 308b; and finally, doped silicon features are epitaxially grown in the recesses. In the present embodiment, these doped silicon features include a p-type dopant, such as B or In, to form source/drain regions of a PFET device.

Figure 15:
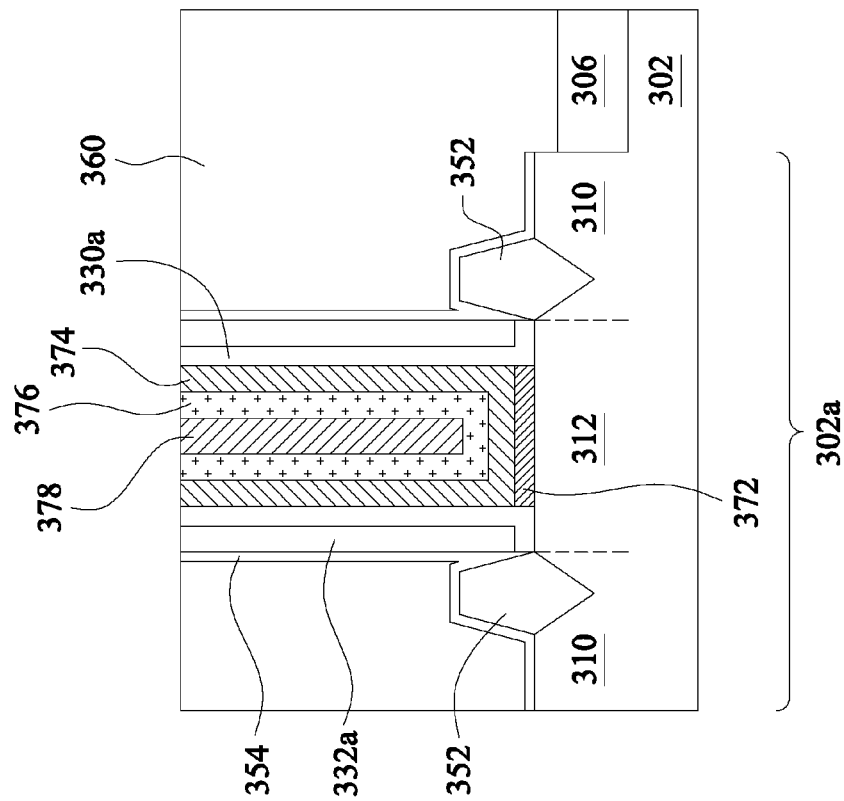
Figure 14:
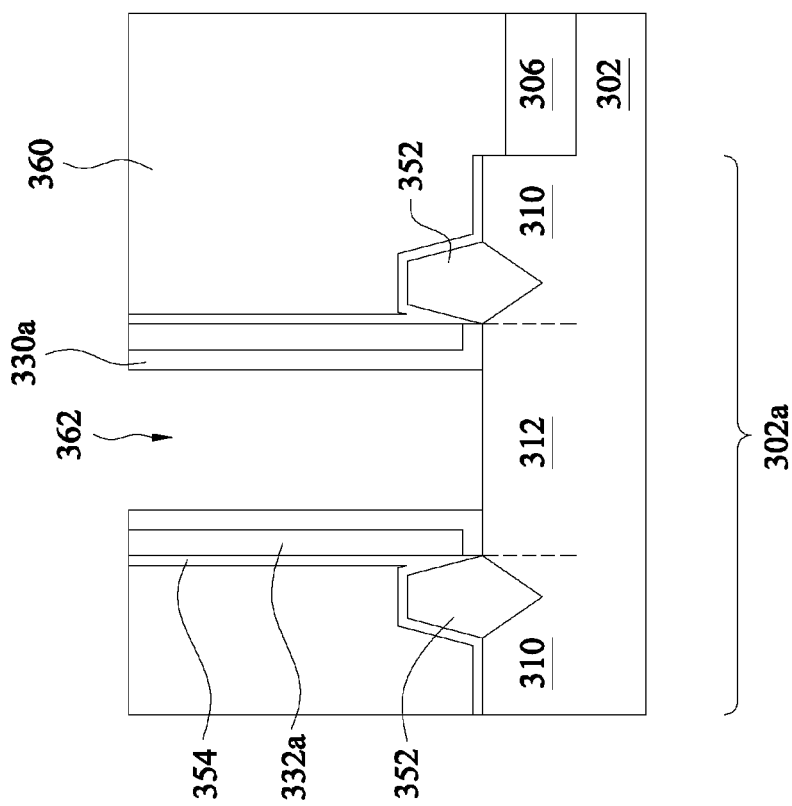

In an embodiment, the method 200 further includes replacing the gate structure 308a and/or 308b with a high-k metal gate stack. FIGS. 14 and 15 illustrate such process in the first region 302a as an example. Referring to FIG. 14, an inter-layer dielectric (ILD) layer 360 is formed over the first region 302a. The gate structure 308a is removed thereby forming an opening 362 at least partially surrounded by the spacers 330a and 332a. In an embodiment, the ILD layer 360 is formed by a flowable CVD (FCVD) process. The FCVD process includes depositing a flowable material (such as a liquid compound) on the substrate 302 to fill the trenches and converting the flowable material to a solid material by a suitable technique, such as annealing in one example. Then, a CMP process is performed to the ILD layer 360 and the hard mask layer 354 to expose the gate structure 308a. Subsequently, the gate structure 308a is removed by one or more etching processes thereby forming the opening 362. Due to the carbon implantation in operation 208, the spacers 330a and 332a are able to maintain their profile and thickness during the etching processes.

Referring to FIG. 15, one or more material layers are deposited into the opening 362 to complete the gate-last process. In the example shown in FIG. 15, the final gate stack includes an interfacial layer 372, a dielectric layer 374, a work function metal layer 376, and a fill layer 378. The interfacial layer 372 may include a dielectric material such as silicon oxide or silicon oxynitride, and may be formed by chemical oxidation, thermal oxidation, ALD, CVD, and/or other suitable dielectric. The dielectric layer 374 may include a high-k dielectric layer such as hafnium oxide ($HfO_2$), $Al_2O_3$, lanthanide oxides, $TiO_2$, HfZrO, $Ta_2O_3$, HfSiO$_4$, ZrO$_2$, ZrSiO$_2$, combinations thereof, or other suitable material. The dielectric layer 374 may be formed by ALD and/or other suitable methods. In the present embodiment, the work function metal layer 376 is an n-type work function layer and may be deposited by CVD, PVD, and/or other suitable process. The fill layer 378 may include aluminum (Al), tungsten (W), or copper (Cu) and/or other suitable materials, and may be formed by CVD, PVD, plating, and/or other suitable processes. A CMP process may be performed to remove excess materials from the gate stack and to planarize a top surface of the device 300. Because the spacers 330a and 332a maintain their profile and thickness substantially unchanged through the various etching processes, the gate stack are sealed within the spacers 330a and 332a and do not intrude into the doped silicon features 352, overcoming the issues presented in FIG. 1B. Further processes, such as contact and via formation, interconnect processing, etc., may be performed subsequently to complete the device 300 fabrication.

Although not intended to be limiting, one or more embodiments of the present disclosure provide many benefits to a semiconductor device and the formation thereof. For example, with carbon implantation at a tilted angle, gate spacers on sidewalls of gate structures attain increased etch resistance. As a result, the gate spacers are able to maintain their profile and thickness throughout various etching processes, such as in forming source/drain features and high-k metal gate stacks. This prevents accidental breakdown of the gate spacers which would cause metal intrusion from the metal gate stacks to the source/drain features. For another example, in a FinFET fabrication process, spacers on sidewalls of fins are also implanted with carbon and attain increased etch resistance. As a result, the height of these spacers can be well controlled when the fins are etched, benefiting a subsequent epitaxial growth process.

In one exemplary aspect, the present disclosure is directed to a method of forming a semiconductor device. The method includes receiving a substrate with a gate structure; forming a spacer layer over the substrate and the gate structure; implanting carbon into the spacer layer at a first angle tilted away from a first direction that is perpendicular to a top surface of the substrate; and etching the spacer layer to expose the gate structure, resulting in a first portion of the spacer layer on sidewalls of the gate structure.

In another exemplary aspect, the present disclosure is directed to a method of forming a FinFET device. The method includes receiving a substrate having a fin and a gate structure over the fin. The method further includes forming a spacer layer over the substrate, the fin, and the gate structure. The method further includes implanting carbon into the spacer layer both on sidewalls of the fin and on sidewalls of the gate structure. The method further includes etching the spacer layer to expose the gate structure and the fin, resulting in a first portion of the spacer layer on the sidewalls of the gate structure and a second portion of the spacer layer on the sidewalls of the fin.

In another exemplary aspect, the present disclosure is directed to a method of forming a semiconductor device. The method includes receiving a substrate with a first gate structure in a first region of the substrate and a second gate structure in a second region of the substrate. The method further includes forming a spacer layer over the substrate, wherein a first portion of the spacer layer is over the first region of the substrate and over the first gate structure, and a second portion of the spacer layer is over the second region of the substrate and over the second gate structure. The method further includes implanting carbon into the spacer layer at a first angle that is tilted away from a normal to a top surface of the substrate. The method further includes etching the first portion of the spacer layer to expose the first region of the substrate and the first gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising the steps of:
    receiving a substrate with a gate structure;
    forming a spacer layer over the substrate and the gate structure;
    implanting carbon into the spacer layer at a first angle tilted away from a first direction that is perpendicular to a top surface of the substrate;
    implanting germanium into the spacer layer at the first direction; and
    after the implanting the germanium, etching the spacer layer to expose the gate structure, resulting in a first portion of the spacer layer on sidewalls of the gate structure.

2. The method of claim 1, wherein the first angle is in a range from about 10 to about 45 degrees.

3. The method of claim 1, wherein the implanting of carbon is performed with an energy ranging from about 0.5 to about 5 keV and a dose ranging from about $1 \times e^{14}$ to about $2 \times e^{15}$ cm$^{-3}$.

4. The method of claim 1, wherein the spacer layer includes silicon nitride that is deposited using atomic layer deposition.

5. The method of claim 1, wherein the gate structure engages with a fin of the substrate, the spacer layer is also deposited over the fin, and the etching of the spacer layer also exposes the fin, further comprising:
    etching recesses into the fin while a second portion of the spacer layer on sidewalls of the fin remains; and
    epitaxially growing silicon in the recesses.

6. The method of claim 5, wherein the second portion of the spacer layer has a height in a range from about 11 to about 13 nanometers.

7. The method of claim 1, further comprising, before the implanting of carbon:
    form lightly doped source/drain (LDD) features in the substrate by ion implantation.

8. The method of claim 1, wherein the gate structure includes a dummy gate electrode layer, further comprising:
    removing the dummy gate electrode layer thereby forming an opening that is at least partially surrounded by the first portion of the spacer layer; and
    forming a metal gate stack in the opening.

9. A method of forming a FinFET device, comprising the steps of:
    receiving a substrate having a fin and a gate structure over the fin;
    forming a spacer layer over the substrate, the fin, and the gate structure;

implanting carbon into the spacer layer both on sidewalls of the fin and on sidewalls of the gate structure; and etching the spacer layer to expose the gate structure and the fin, resulting in a first portion of the spacer layer on the sidewalls of the gate structure and a second portion of the spacer layer on the sidewalls of the fin.

10. The method of claim 9, wherein the implanting of carbon is performed at an angle tilted away from a normal to a top surface of the substrate and the angle ranges from about 10 to about 45 degrees.

11. The method of claim 10, wherein the implanting of carbon is performed with an energy ranging from about 0.5 to about 5 keV and a dose ranging from about $1 \times e^{14}$ to about $2 \times e^{15}$ cm$^{-3}$.

12. The method of claim 9, further comprising, before the etching of the spacer layer:

implanting germanium into the spacer layer at a direction perpendicular to a top surface of the substrate.

13. The method of claim 12, wherein the implanting of the germanium is performed with an energy ranging from about 1 to about 10 keV and a dose ranging from about $1 \times e^{14}$ to about $2 \times e^{15}$ cm$^{-3}$.

14. The method of claim 9, further comprising:

etching the fin adjacent to the gate structure thereby forming recesses in the fin, wherein a third portion of the second portion of the spacer layer remains over the substrate and the third portion has a height of about 11 to about 13 nanometers.

15. A method of forming a semiconductor device, comprising the steps of:

receiving a substrate with a first gate structure in a first region of the substrate and a second gate structure in a second region of the substrate;

forming a spacer layer over the substrate, wherein a first portion of the spacer layer is over the first region of the substrate and over the first gate structure, and a second portion of the spacer layer is over the second region of the substrate and over the second gate structure;

implanting carbon into the spacer layer at a first angle that is tilted away from a normal to a top surface of the substrate;

implanting germanium into the spacer layer at a direction parallel to the normal to the top surface of the substrate;

after the implanting the germanium, etching the first portion of the spacer layer to expose the first region of the substrate and the first gate structure; and etching a first plurality of recesses in the first region of the substrate adjacent to the first gate structure.

16. The method of claim 15, further comprising:

epitaxially growing first doped silicon features in the first plurality of recesses;

forming a hard mask layer covering the first region of the substrate, the first doped silicon features, and the first gate structure;

etching the second portion of the spacer layer to expose the second region of the substrate and the second gate structure;

etching a second plurality of recesses in the second region of the substrate adjacent to the second gate structure; and epitaxially growing second doped silicon features in the second plurality of recesses, wherein the first and second doped silicon features have opposite types of dopants.

17. The method of claim 15, wherein the first angle is in a range from about 10 to about 45 degrees.

18. The method of claim 15, wherein the implanting of carbon is performed with an energy ranging from about 0.5 to about 5 keV and a dose ranging from about $1 \times e^{14}$ to about $2 \times e^{15}$ cm$^{-3}$.

19. The method of claim 15, wherein the first region of the substrate is an active region for forming NFET devices and the second region of the substrate is an active region for forming PFET devices.

\* \* \* \* \*